(12) United States Patent
Nguyen et al.

(10) Patent No.: US 6,812,142 B1
(45) Date of Patent: Nov. 2, 2004

(54) METHOD AND INTERLEVEL DIELECTRIC STRUCTURE FOR IMPROVED METAL STEP COVERAGE

(75) Inventors: Loi Nguyen, Carrollton, TX (US); Ravishankar Sundaresan, Garland, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/712,827

(22) Filed: Nov. 14, 2000

Related U.S. Application Data

(63) Continuation of application No. 08/169,337, filed on Dec. 17, 1993, now abandoned.

(51) Int. Cl.[7] .......................................... H01L 21/4763
(52) U.S. Cl. ...................... 438/640; 438/618; 438/621; 438/634; 438/637
(58) Field of Search ................................ 438/618, 621, 438/634, 637, 640

(56) References Cited

U.S. PATENT DOCUMENTS

| | | | |
|---|---|---|---|
| 4,252,595 A | * | 2/1981 | Yamamoto et al. |
| 4,352,724 A | | 10/1982 | Sugishima et al. |
| 4,372,034 A | | 2/1983 | Bohr |
| 4,686,000 A | | 8/1987 | Heath .......................... 156/643 |
| 4,824,767 A | | 4/1989 | Chambers et al. .......... 430/313 |
| 5,063,176 A | | 11/1991 | Lee et al. .................... 437/195 |
| 5,166,088 A | | 11/1992 | Ueda et al. .................... 437/47 |
| 5,266,516 A | | 11/1993 | Ho .............................. 437/57 |
| 5,308,415 A | * | 5/1994 | Chou |

FOREIGN PATENT DOCUMENTS

| | | |
|---|---|---|
| EP | 0 523 856 A2 | 6/1991 |
| EP | 0 534 130 A1 | 3/1993 |
| JP | 60246675 | 6/1985 |
| JP | 4196486 | 7/1992 |
| JP | 5074958 | 3/1993 |

OTHER PUBLICATIONS

"VLSI Fabrication Principles," by Sorab K. Ghandhi, Rensselaer Polytechnic Institute, A Wiley–Interscience Publication, John Wiley & Sons, 1983, pp. 479–482, 499–501.

* cited by examiner

*Primary Examiner*—Long Pham
(74) *Attorney, Agent, or Firm*—Lisa K. Jorgenson; William A. Munck

(57) ABSTRACT

A VLSI contact formation process in which a nitride layer is used to stop a wet oxide etch. An anisotropic plasma etch is used to cut a substantially vertical contact hole through the nitride and underlying layers. Thus, the resulting contact hole has a "Y"-shaped profile.

16 Claims, 2 Drawing Sheets

METHOD AND INTERLEVEL DIELECTRIC STRUCTURE FOR IMPROVED METAL STEP COVERAGE

This is a continuation of Ser. No. 08/169,337, filed Dec. 17, 1993, now abandoned.

BACKGROUND AND SUMMARY OF THE INVENTION

The present invention relates to integrated circuit structures and fabrication methods.

In integrated circuit fabrication, a key area of concentration has been the fabrication of contacts. Contact holes must usually be etched down through a significant thickness of interlevel dielectric, and significant issues arise. Contact holes are normally etched simultaneously to the active region and to the poly-1 level (polycide gate conductor), and thus the interlevel dielectric will be much thicker over some locations, especially when the dielectric has been planarized. (Planarization of the interlevel dielectric is highly desirable to minimize topographic excursion, but means that in some locations the contact holes may tend to have a very large aspect ratio.) This means that a large amount of overetch must be tolerated at the contacts to the poly-1 level.

For best mechanical properties of the metal layer, it would be desirable to provide sloped contact hole sidewalls. This has commonly been done with oxide reflow techniques, in which a short high-temperature treatment of a doped silicate glass produces nicely rounded corners (due to the surface tension effects on the silicate glass layer when it softens). One problem with this approach is that the required time at high-temperature is increasingly undesirable as geometries shrink.

Another approach has been to use a fairly isotropic etch, to produce a contact hole with sloped sidewalls; but this consumes a large area. The lateral spread of the contact sidewalls means that a significant spacing must be required between contacts to active and the poly-1 layer, to prevent shorts to poly-1.

To achieve the best packing density, it would be desirable to use holes with nearly vertical sidewalls. However, such holes have a high aspect ratio (height/width ratio), and pose processing difficulties. Such geometries may present difficulties in completely filling the contact hole, or may cause an undesirable lack of planarity where the metal layer crosses over the hole. Such problems have been addressed by "stud contact" processes (where deposition and etchback of a highly conformal metal, such as W, precede deposition of a following metal such as Al:Cu). However, such processes add expense and complexity, and are more often used for vias than contacts.

One proposed method uses a second poly as the "landing pads" for bitline contacts in the matrix. In this way, the wordlines are protected thereby allowing for zero contact-to-gate spacing. The drawback is that this method cannot be used in the periphery due to contact resistance problems which result in slower operation of the device.

Another method uses a silicon nitride deposition on top of the polycide prior to pattern and etch. (See Singer, "A New Technology for Oxide Contact and Via Etch", SEMICONDUCTOR INTERNATIONAL, August 1993, p.36, which is hereby incorporated by reference.) Through the use of highly selective nitride to oxide etch selectivities, this will reduce the possibility of the contact touching the top of the polycide; however, it can still make contact along the sidewall due to the removal of the oxide spacer. Additionally, this does not address the problem of overetching the field oxide during the spacer etch.

Still another proposed method uses an $Al_2O_3$ etch-stop layer to achieve a zero-margin contact process. (See Fukase et al., "A Margin-Free Contact Process Using an $Al_2O_3$ Etch-Stop Layer for High-Density Devices," 1992 IEDM PROCEEDINGS 33.3, which is hereby incorporated by reference.).

The present application sets forth a new approach to contact formation, using a combination of isotropic and anisotropic etch steps to produce a contact profile which has steep sidewalls at its bottom portion and sloped sidewalls at its top portion. This approach recognizes that the constraints on the top part of the contact hole are different from those on the bottom part of the contact hole, and accordingly obtains the advantages of both steep-sidewall and sloped-sidewall geometries:

at the lower level, the contact occupies only a small area, and hence it is not necessary to impose large minimum spacing from the contact to adjacent polysilicon;

at the upper level, the contact has nicely sloped sidewalls, so that problems of metal voids and cracking, and electromigration are greatly simplified.

The present application also describes a new method of forming sub-micron contact utilizing $Si_3N_4$ (or other dielectric film with good etch selectivity to oxide film) as an etch stop for a WET oxide etch. After the wet etch, an anisotropic plasma etch is used to cut a substantially vertical contact hole through the nitride and underlying layers. Thus, the resulting contact hole has a "Y"-shaped profile.

Since the lower silicate glass layer and the nitride layer are not highly planarized, they provide area-efficient protection of the devices from any lateral encroachments which might occur during contact etching. Most of the planarization is performed in the upper silicate glass layer.

Thus, the lower silicate glass layer and the nitride layer provide self-aligned protection for the gate layer. This protection ensures that no possible combination of geometries will permit the contact etch to create a short circuit to the gate layer.

According to a disclosed class of innovative embodiments, there is provided: A fabrication method, comprising the steps of: providing a partially fabricated integrated circuit structure which includes transistors; forming an interlevel dielectric structure over said transistors, said interlevel dielectric including at least a lower layer having a first composition, a middle layer having a second composition which is different from said first composition, and an upper layer having a third composition which is different from said second composition; etching through said upper layer, using a relatively isotropic etch process which is selective to said second composition; etching through said middle and lower layers, using a relatively anisotropic etch process, to expose portions of said transistors; and depositing and patterning a thin-film conductor layer, to interconnect said transistors in a desired pattern.

According to another disclosed class of innovative embodiments, there is provided: A fabrication method, comprising the steps of: providing a partially fabricated integrated circuit structure which includes transistors; forming an interlevel dielectric structure over said transistors, said interlevel dielectric including at least a lower layer consisting predominantly of silicate glass, a middle layer consisting predominantly of silicon nitride, and an upper layer consisting predominantly of doped silicate glass; etching through said upper layer, using a relatively isotropic etch process which is selective to said second composition; etching through said middle and lower layers, using a relatively anisotropic etch process, to expose portions of said transistors; and depositing and patterning a thin-film conductor layer, to interconnect said transistors in a desired pattern.

According to another disclosed class of innovative embodiments, there is provided: A method, comprising the steps of: providing a partially fabricated integrated circuit structure which includes transistors; forming an interlevel dielectric structure over said transistors, said interlevel dielectric including at least a lower layer having a first composition, a middle layer having a second composition which is different from said first composition, and an upper layer having a third composition which is different from said second composition; etching through said upper layer, using a wet etch process which is selective to said second composition; etching through said middle and lower layers, using a relatively anisotropic plasma etch process, to expose portions of said transistors; and depositing and patterning a thin-film conductor layer, to interconnect said transistors in a desired pattern.

According to another disclosed class of innovative embodiments, there is provided: A method, comprising the steps of: providing a partially fabricated integrated circuit structure which includes transistors; forming an interlevel dielectric structure over said transistors, said interlevel dielectric including at least a lower layer having a first composition, a middle layer having a second composition which is different from said first composition, and an upper layer having a third composition which is different from said second composition; etching through said upper layer, using a wet etch process which is selective to said second composition; etching through said middle and lower layers, using a relatively anisotropic plasma etch process, to expose portions of said transistors; and depositing and patterning a thin-film metal layer, without any intermediate etchback steps, to interconnect said transistors in a desired pattern.

According to another disclosed class of innovative embodiments, there is provided: An integrated circuit, comprising: a substrate having transistors formed at one surface thereof; an interlevel dielectric overlying said transistors, and having at least upper, middle, and lower layers, said middle layer having a different composition from said upper layer and from said lower layer, and having contact holes therein extending vertically therethrough, said contact holes having vertical sidewalls in said lower layer and sloped sidewalls in said upper layer; and a patterned thin-film metal layer extending through said contact holes to interconnect said transistors in a desired electrical configuration.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
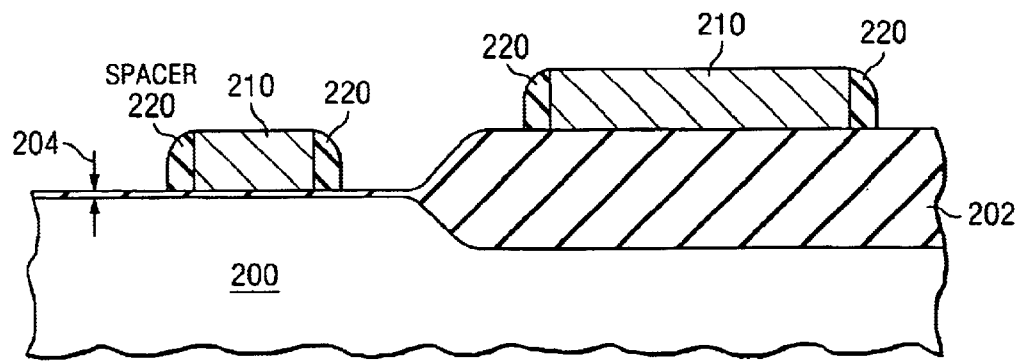
FIG. 1 shows a partially fabricated integrated circuit structure, complete through formation of transistor structures.

FIG. 1 shows a partially fabricated integrated circuit structure, complete through formation of transistor structures. Fabrication to this point has been entirely conventional, e.g. with preparation of silicon wafer 200, formation of N-wells and P-wells, formation of field oxide 202 to e.g. 6000 Å, sacrificial oxide grown and stripped, growth of gate oxide 204 to e.g. 150 Å, threshold voltage adjustment, deposition of polycide gate 210 to e.g. 3500 Å total thickness, LDD and/or HALO implant or implants, formation of sidewall spacers 220, and N+ and P+ source/drain implants. This results in the structure of FIG. 1.

Thereafter a somewhat unusual interlevel dielectric is deposited. In the presently preferred embodiment, this is performed by the steps of:

1. deposit undoped oxide 230 to e.g. 1000 to 2000 Å.
2. deposit a first layer 232 of BPSG (borophosphosilicate glass) or PSG (phosphosilicate glass) to e.g. 1000 to 2000 Å.
3. deposit $Si_3N_4$ layer 234 to e.g. 500 to 1000 Å
4. deposit a second layer 236 of BPSG to e.g. 3000 to 4000 Å;
5. BPSG reflow/densification (e.g. 25 minutes at a temperature of 875° C., in the presently preferred embodiment).

Figure 2:
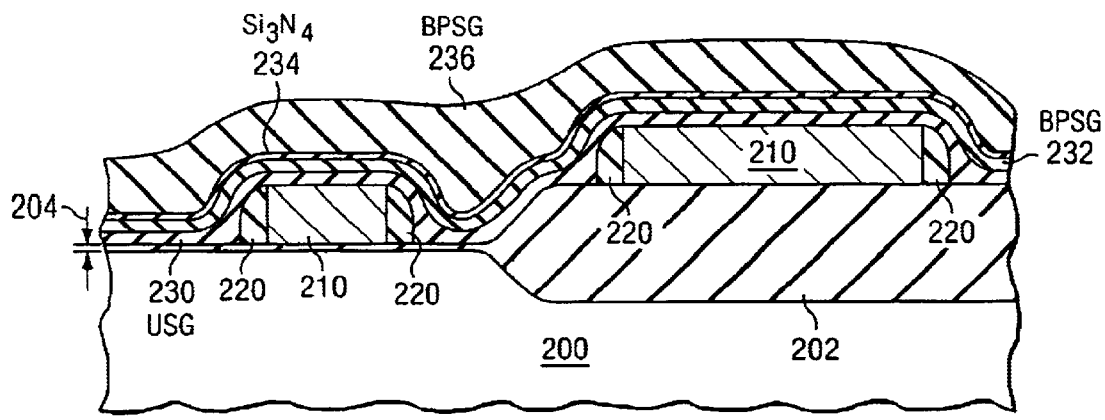
FIG. 2 shows the integrated circuit structure of FIG. 1, at a later stage of fabrication according to the present invention.

This produces the structure of FIG. 2. In this structure, note that the reflow of the second BPSG layer has produced some planarization.

A photoresist layer 240 is now deposited, baked, patterned, and developed, to provide apertures over desired contact hole locations. A wet etch is now performed (e.g. 250 minutes at a temperature of 25° C. in an aqueous solution of 7:1 buffered HF). This etch chemistry has essentially infinite selectivity to nitride, so the nitride layer 234 provides a good etch stop.

Figure 3:
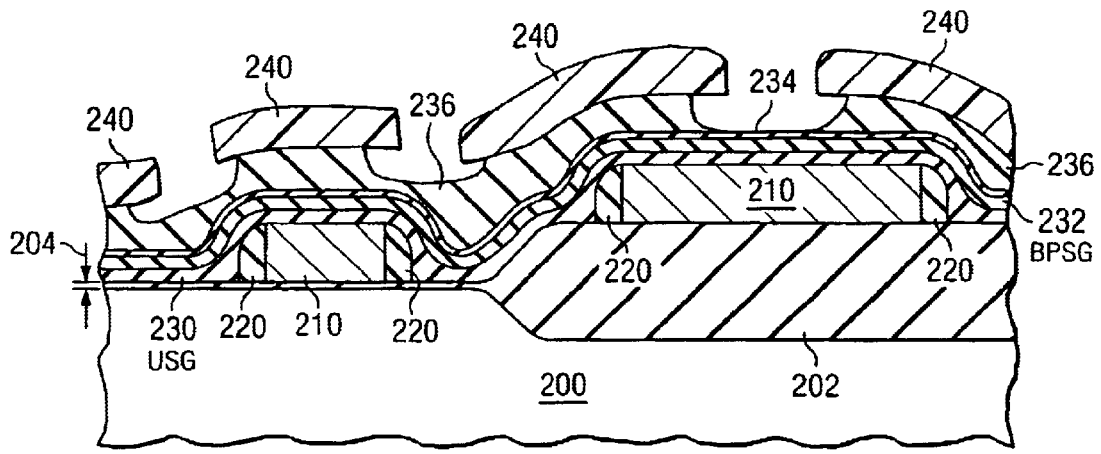
FIG. 3 shows the integrated circuit structure of FIG. 2, after masking has been formed and an isotropic etch has been performed at contact hole locations.

This produces the structure shown in FIG. 3. Note that the wet etch has significantly undercut the photoresist mask 240.

An anisotropic etch is now performed, using e.g. a conventional fluoro-etch chemistry which is not selective between oxide and nitride. This cuts through nitride 234, and underlying silicate glass layers 230/232, to expose silicon at the desired contact locations.

Metal 250 is now deposited, e.g. 600 Å of Ti followed by 1000 Å of TiN followed by rapid thermal annealing (to induce silicidation in the contact hole) followed by deposition of a metal such as Al:Cu. The metal layer is then patterned to achieve the desired circuit configuration.

Figure 4:
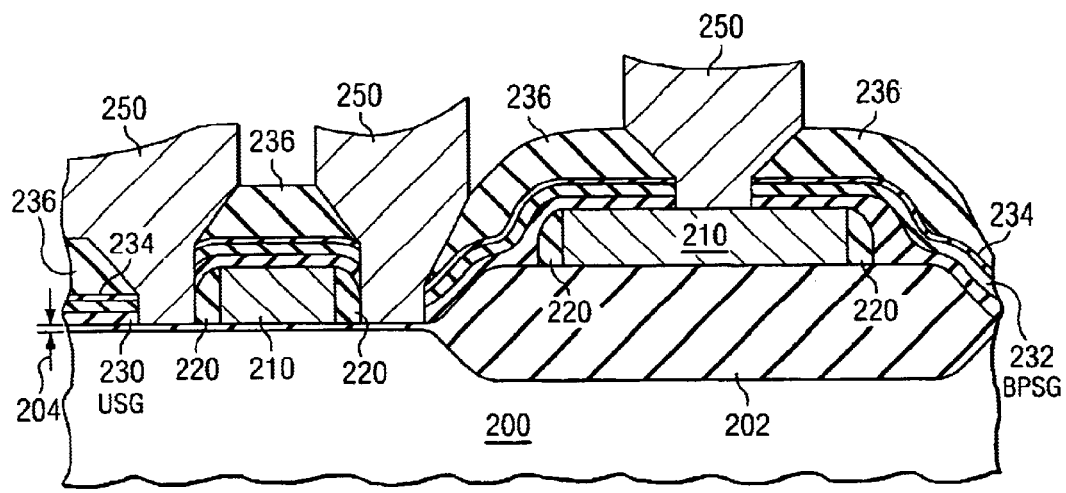
FIG. 4 shows the integrated circuit structure of FIG. 3, after an anisotropic etch has been performed using the contact mask and metal has been deposited and patterned.

This results in the structure of FIG. 4.

Processing may then continue with conventional further steps, e.g. deposition of a further interlevel dielectric and a second metal layer (if desired), contact sinter (if needed), deposition and densification of a protective overcoat and removal thereof to expose contact pad locations.

Figure 5:
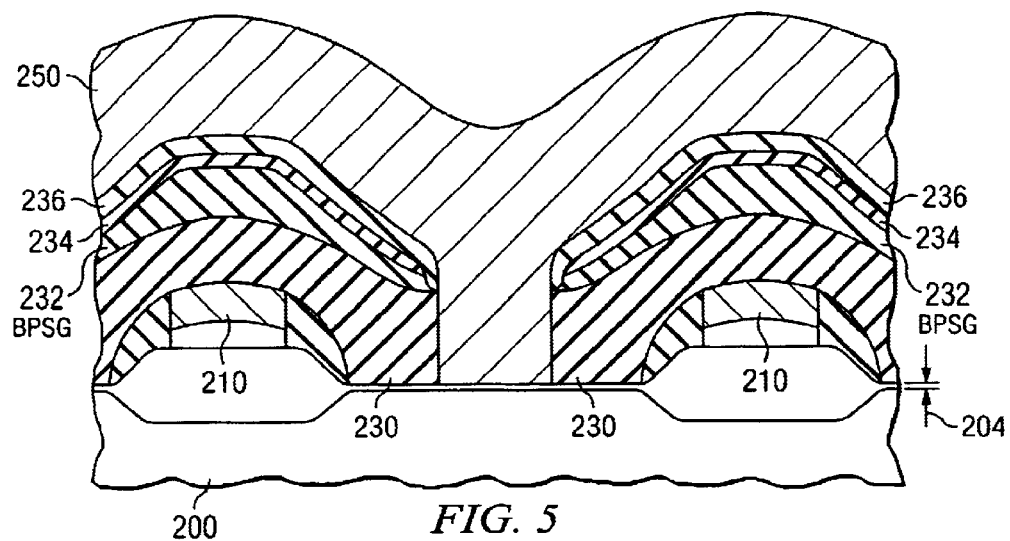
FIG. 5 is a micrograph which shows an example of a contact fabricated using the disclosed inventions.

FIG. 5 is a micrograph which shows an example of a contact fabricated using the disclosed inventions.

Advantages

The disclosed innovations provide at least the following advantages:

- metal-to-gate shorts due to overetch during wet oxide etch are completely prevented;
- The full film thickness of the first BPSG film is available for gettering, which improves device reliability. (Silicate glasses, unlike nitride, have the ability to trap ionic impurities.)
- Significant contact aspect ratio reduction to improve metal step coverage, without degrading the contact-to-poly spacing. the reduced aspect ratio provides better sidewall coverage for the adhesion and diffusion-barrier layers which are the first part of the metallization stack, and helps to protect against voids and step coverage difficulties.
- The $Si_3N_4$ film also provides passivation against hydrogen. Exposure to hydrogen can increase the value of a polysilicon resistor by a factor of 2x or 3x. Thus, in device structures using "poly R" resistor structures, indiffusion of hydrogen may cause a shift in resistor values. The nitride layer thus helps to prevent this, and provides improved stability.
- A simple metallization process, without a plug metal deposition and intermediate etchback, can be used.
- There is no need to reflow the interlevel dielectric after contact etch.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course a variety of structures can be used to implement the polysilicon or polycide gate. Similarly, a wide variety of materials, and of combinations of materials, can be used to implement the metal layer.

Of course, the specific etch chemistries, layer compositions, and layer thicknesses given are merely illustrative, and do not by any means delimit the scope of the claimed inventions.

The invention can also be adapted to other combinations of dielectric materials in the interlevel dielectric. For example, phospho-silicate glass or germanosilicate glass can be used instead of the BPSG of the presently preferred embodiment.

The innovative process preferably uses at least a three-level dielectric stack, in which the top layer can be etched selectively with respect to the middle layer. Preferably the top and bottom layers are both silicate glasses, but it will be recognized by those skilled in the art that other materials can be substituted for the silicates or for the nitride. It will also be recognized that additional layers can be added if desired.

It should be, recognized that the first etch step does not have to be perfectly isotropic, but may still function adequately with a modest anisotropy. It should also be noted that the first etch step can be implemented with a high-pressure plasma or afterglow etch instead of a wet etch, IF the etch chemistry used provides high selectivity to nitride.

Similarly, while the sidewall spacers 220 are normally used, they are not strictly necessary to the practice of the invention.

While the disclosed process could be used for via formation, it is much less preferable in that context. The dielectric constant for nitride is about twice that for oxide, so that the parasitic capacitive loading on the metal lines would be increased.

While the inventions have been described with primary reference to a single-poly process, it will be readily recognized that these inventions are equally applicable to double-poly or triple-poly structures and processes. Similarly, while the contact from first metal to first poly and active has been particularly described, it will be readily recognized that the disclosed inventions are equally applicable to processes with multiple layers of metal.

The innovative process teachings may also be adapted for contact formation in bipolar or other device technologies.

Similarly, it will be readily recognized that the described process steps can also be embedded into hybrid process flows, such as BiCMOS or smart-power processes.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A fabrication method comprising the steps of:

forming a dielectric structure over a contact region the dielectric structure comprising:
   a first layer formed from silicon nitride;
   a second layer overlying the first layer and formed from borophosphosilicate glass,
   wherein borophosphosilicate class may be selectively etched with respect to the silicon nitride; and
   a third layer underlying the first layer and formed from a silicate glass doped with a gettering agent;
   forming and patterning a resist layer over the dielectric structure;
   selectively etching the second layer through an opening through the patterned resist layer utilizing an etch which is selective of the first material over the second material; and
   without stripping the resist layer, etching the dielectric structure through the opening within the patterned resist layer and any etched region within the second layer to form a contact opening extending through the dielectric structure and exposing the contact region.

2. The method of claim 1, wherein the step of selectively etching the second layer through an opening through the patterned resist layer utilizing an etch which is selective of the first material over the second material further comprises:

etching an opening through the second layer.

3. The method of claim 2, wherein the step of etching an opening through the second layer further comprises:

utilizing a relatively isotropic etch process to etch the opening through the second layer, wherein the opening through the second layer undercuts the patterned resist layer.

4. The method of claim 2, wherein the step of etching an opening through the second layer further comprises:

utilizing a wet etch process to etch the opening through the second layer.

5. The method of claim 2, wherein the step of etching the dielectric structure through the opening within the patterned resist layer and any etched region within the second layer to form a contact opening extending through the dielectric structure and exposing the contact region further comprises:

utilizing a relatively anisotropic etch process to etch a remainder of the opening extending through the dielectric structure through the opening within the patterned resist layer.

6. The method of claim 2, wherein the step of etching the dielectric structure through the opening within the patterned resist layer and any etched region within the second layer to form a contact opening extending through the dielectric structure and exposing the contact region further comprises:

utilizing a plasma etch process to etch a remainder of the opening extending through the dielectric structure through the opening within the patterned resist layer, the patterned resist layer masking the plasma etch process.

7. An intermediate integrated circuit structure comprising:
a substrate including a contact region;
a dielectric structure over the substrate, the dielectric structure comprising:
  a first layer formed from a first material;
  a second layer overlying the first layer and formed from a second material which may be selectively etched with respect to the first material; and
  a third layer underlying the first layer and formed from a material different than the first material;
an opening through the dielectric structure and exposing the contact region, the opening including
  a first portion extending through the second layer having sloped or concave sidewalls, and
  a second portion extending through the first layer and having substantially vertical sidewalls; and
a patterned resist layer overlying the dielectric structure, the patterned resist layer having an opening therethrough over the opening through the dielectric structure,
wherein the first layer is formed of silicon nitride, the second layer is formed of borophosphosilicate glass, and the third layer is formed of a silicate glass doped with a gettering agent.

8. The intermediate integrated circuit structure of claim 7, wherein the first portion of the opening through the dielectric structure undercuts the patterned resist layer.

9. The intermediate integrated circuit structure of claim 7, wherein the opening through the dielectric structure has a Y-shaped profile.

10. The intermediate integrated circuit structure of claim 7, wherein the opening through the dielectric structure is wider within the first portion than the opening through the patterned resist layer.

11. The intermediate integrated circuit structure of claim 7, wherein the opening through the dielectric structure has a width within the second portion approximately equal to a width of the opening through the patterned resist layer.

12. A method of forming a contact opening, comprising:
forming a dielectric structure over a contact region, the dielectric structure comprising:
  a first layer formed from a first material;
  a second layer overlying the first layer and formed from a second material which may be selectively etched with respect to the first material; and
  a third layer underlying the first layer and formed from a third material different from the first material;
forming and patterning a resist layer over the dielectric structure;
selectively etching the second layer through an opening through the patterned resist layer utilizing a relatively isotropic etch process which is selective of the first material over the second material and which undercuts the patterned resist layer in an etched region formed by the relatively isotropic etch process; and
without stripping the resist layer, etching the dielectric structure, utilizing a relatively anisotropic etch process, through the opening within the patterned resist layer and the etched region within the second layer to form a contact opening extending through the dielectric structure and exposing the contact region.

13. The method of claim 12, wherein the step of selectively etching the second layer through an opening through the patterned resist layer utilizing a relatively isotropic etch process which is selective of the first material over the second material and which undercuts the patterned resist layer in an etched region formed by the relatively isotropic etch process further comprises:

etching an opening through the second layer utilizing the first layer as an etch stop.

14. The method of claim 13, wherein the step of selectively etching the second layer through an opening through the patterned resist layer utilizing a relatively isotropic etch process which is selective of the first material over the second material and which undercuts the patterned resist layer in an etched region formed by the relatively isotropic etch process further comprises:

wet etching the opening through the second layer utilizing hydroflouric acid, wherein the second layer is formed of a borophosphosilicate glass.

15. The method of claim 13, wherein the step of etching the dielectric structure, utilizing a relatively anisotropic etch process, through the opening within the patterned resist layer and the etched region within the second layer to form a contact opening extending through the dielectric structure and exposing the contact region further comprises:

plasma etching a remainder of the opening through the dielectric structure through the opening through the patterned resist layer and through the opening through the second layer.

16. The method of claim 15, wherein the step of plasma etching a remainder of the opening through the dielectric structure through the opening through the patterned resist layer and through the opening through the second layer further comprises:

masking the plasma etching process with the patterned resist layer.

* * * * *